United States Patent
Wang et al.

(10) Patent No.: US 12,230,897 B2
(45) Date of Patent: Feb. 18, 2025

(54) CIRCUIT BOARD ASSEMBLY, DISPLAY ASSEMBLY AND ASSEMBLING METHOD THEREFOR, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Fengxian Wang, Beijing (CN); Chuanyan Lan, Beijing (CN); Qiang Tang, Beijing (CN); Xianlei Bi, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 191 days.

(21) Appl. No.: 17/925,623

(22) PCT Filed: Oct. 11, 2021

(86) PCT No.: PCT/CN2021/123144
§ 371 (c)(1),
(2) Date: Nov. 16, 2022

(87) PCT Pub. No.: WO2022/100334
PCT Pub. Date: May 19, 2022

(65) Prior Publication Data
US 2023/0180448 A1  Jun. 8, 2023

(30) Foreign Application Priority Data
Nov. 16, 2020 (CN) .......................... 202011281093.1

(51) Int. Cl.
 *H01Q 7/00* (2006.01)
 *H05K 3/34* (2006.01)
 *H01Q 1/24* (2006.01)

(52) U.S. Cl.
 CPC ............... *H01Q 7/00* (2013.01); *H05K 3/341* (2013.01); *H01Q 1/243* (2013.01)

(58) Field of Classification Search
 CPC ....... G06K 19/07779; G06K 19/07781; G06K 19/07783
 See application file for complete search history.

(56) References Cited

U.S. PATENT DOCUMENTS

2004/0140414 A1  7/2004 Chen
2013/0015938 A1* 1/2013 Park ...................... H01Q 1/243
 336/232

(Continued)

FOREIGN PATENT DOCUMENTS

CN  102892256 A  1/2013
CN  104221216 A  12/2014

(Continued)

OTHER PUBLICATIONS

Decision of Rejection for Chinese Patent Application No. 202011281093.1 issued by the Chinese Patent Office on Feb. 16, 2022.

(Continued)

*Primary Examiner* — Daniel Munoz
(74) *Attorney, Agent, or Firm* — IP & T GROUP LLP

(57) ABSTRACT

A circuit board assembly includes a connection circuit board, a near field communication antenna and solders. The connection circuit board includes circuit board pads. The near field communication antenna is attached to the connection circuit board, and the near field communication antenna includes: an antenna coil, antenna pads electrically con- (Continued)

nected to the antenna coil, and through holes penetrating the antenna pads and disposed opposite to the circuit board pads. The solders are connected to the circuit board pads through the through holes.

17 Claims, 9 Drawing Sheets

(56) References Cited

U.S. PATENT DOCUMENTS

| | | | |
|---|---|---|---|
| 2015/0070233 A1 | 3/2015 | Nakamura et al. | |
| 2015/0214619 A1* | 7/2015 | Shimizu | H01Q 9/27 343/867 |
| 2017/0324147 A1 | 11/2017 | Lee et al. | |
| 2022/0374048 A1 | 11/2022 | Niu et al. | |

FOREIGN PATENT DOCUMENTS

| | | |
|---|---|---|
| CN | 204361741 U | 5/2015 |
| CN | 107425261 A | 12/2017 |
| CN | 105098324 B | 6/2018 |
| CN | 207572519 U | 7/2018 |
| CN | 110475427 A | 11/2019 |
| CN | 110581362 A | 12/2019 |
| CN | 110767990 A | 2/2020 |
| CN | 211062853 U | 7/2020 |
| CN | 111651096 A | 9/2020 |
| CN | 111712037 A | 9/2020 |
| CN | 112384004 A | 2/2021 |

OTHER PUBLICATIONS

Notice of Reexamination for Chinese Patent Application No. 202011281093.1 issued by the Chinese Patent Office on Oct. 31, 2022.

First Office Action for Chinese Patent Application No. 202011281093.1 issued by the Chinese Patent Office on Jul. 5, 2021.

Second Office Action for Chinese Patent Application No. 202011281093.1 issued by the Chinese Patent Office on Oct. 25, 2021.

* cited by examiner

CIRCUIT BOARD ASSEMBLY, DISPLAY ASSEMBLY AND ASSEMBLING METHOD THEREFOR, AND DISPLAY DEVICE

CROSS-REFERENCE TO RELATED APPLICATIONS

This application is a national phase entry under 35 USC 371 of International Patent Application No. PCT/CN2021/123144, filed on Oct. 11, 2021, which claims priority to Chinese Patent Application No. 202011281093.1, filed on Nov. 16, 2020, which are incorporated herein by reference in their entirety.

TECHNICAL FIELD

The present disclosure relates to the field of display technologies, and in particular, to a circuit board assembly, a display assembly and an assembling method therefor, and a display device.

BACKGROUND

With the development of technology, consumers have higher and higher demand for multi-functional electronic products, near field communication (NFC) technology thus comes into being. The NFC technology is a short-range high-frequency wireless communication technology, which allows electronic devices to perform non-contact point-to-point data transmission (within ten centimeters) and data exchange with each other. Therefore, the NFC technology is widely used in display devices (e.g., mobile phones) to realize functions such as electronic payment and data transmission.

SUMMARY

In a first aspect, some embodiments of the present disclosure provide a circuit board assembly. The circuit board assembly includes a connection circuit board, a near field communication antenna and solders. The connection circuit board includes circuit board pads. The near field communication antenna is attached to the connection circuit board, and the near field communication antenna includes: an antenna coil, antenna pads electrically connected to the antenna coil, and through holes penetrating the antenna pads and disposed opposite to the circuit board pads. The solders are connected to the circuit board pads through the through holes, so that the antenna pads are electrically connected to the circuit board pads, respectively.

In some embodiments, the antenna pads are disposed in a region surrounded by the antenna coil.

In some embodiments, the near field communication antenna includes: a first insulating layer, a first coil, a first carrying layer, a second coil, a second insulating layer, a first adhesive layer and a magnetic material layer that are stacked in sequence. A first end of the first coil is electrically connected to a first end of the second coil to constitute the antenna coil. Numbers of the circuit board pads, the antenna pads, the through holes and the solders each are two. The two antenna pads are both disposed on the first carrying layer, and are electrically connected to a second end of the first coil and a second end of the second coil in a one-to-one correspondence. The two through holes are disposed opposite to the two circuit board pads in a one-to-one correspondence, and each through hole penetrates the first carrying layer and a corresponding antenna pad in the two antenna pads. Each solder is connected to a corresponding circuit board pad in the two circuit board pads through a through hole in the two through holes. The circuit board assembly further includes a second adhesive layer disposed between the magnetic material layer and the connection circuit board.

In some embodiments, the near field communication antenna further includes a third insulating layer disposed on the first carrying layer, and the third insulating layer separates the two antenna pads.

In some embodiments, the antenna pads each include a first sub-pad located on a side of the first carrying layer away from the connection circuit board. The near field communication antenna further includes a fourth insulating layer covering each first sub-pad.

In some embodiments, the connection circuit board includes: a fifth insulating layer, a first conductive layer, a second carrying layer, a second conductive layer and a sixth insulating layer that are stacked in sequence. The circuit board pads are disposed on a surface of the second carrying layer proximate to the near field communication antenna.

In some embodiments, the connection circuit board further includes a first electromagnetic shielding layer and a second electromagnetic shielding layer. The first electromagnetic shielding layer is disposed on a side of the fifth insulating layer away from the second carrying layer, and the second electromagnetic shielding layer is disposed on a side of the sixth insulating layer away from the second carrying layer.

In some embodiments, the connection circuit board further includes a seventh insulating layer disposed on the second carrying layer, and the seventh insulating layer separates the two circuit board pads.

In some embodiments, the antenna pads each include a second sub-pad located on a side of the first carrying layer proximate to the connection circuit board. The connection circuit board further includes an eighth insulating layer formed by a portion of a material for forming the second adhesive layer, and the eighth insulating layer fills in a gap between the circuit board pads and second sub-pads.

In some embodiments, the antenna pads each include a first sub-pad located on a side of the first carrying layer away from the connection circuit board and a second sub-pad located on a side of the first carrying layer proximate to the connection circuit board. The near field communication antenna further includes a third insulating layer disposed on the first carrying layer; the third insulating layer includes an upper insulating layer disposed on a surface of the first carrying layer away from the connection circuit board, and a lower insulating layer disposed on a surface of the first carrying layer proximate to the connection circuit board; the upper insulating layer separates first sub-pads of the antenna pads, and the lower insulating layer separates second sub-pads of the antenna pads.

In some embodiments, the first coil and the first sub-pads of the antenna pads are located in a same layer and made of a same material; and the second coil and the second sub-pads of the antenna pads are located in a same layer and made of a same material.

In some embodiments, the circuit board pads and the first conductive layer are made of a same material.

In a second aspect, some embodiments of the present disclosure provide a display assembly including a display panel and the circuit board assembly according to any one of the embodiments in the first aspect. The near field communication antenna of the circuit board assembly is located on a back side of the display panel, a first end of the connection circuit board of the circuit board assembly is electrically connected to the display panel, and a second end of the connection circuit board is configured to be electrically connected to a main board.

In some embodiments, the display panel includes a panel body and a bending portion connected to a side of the panel body; the bending portion is configured such that a driver chip is disposed thereon, and an end of the bending portion is located on a back side of the panel body and bonded to the first end of the connection circuit board.

In some embodiments, the display panel is a flexible display panel integrated with a touch layer, and the display assembly further includes: a cover plate, a third adhesive layer, a polarizer, a fourth adhesive layer and a heat dissipation film that are stacked in sequence; the panel body is disposed between the fourth adhesive layer and the heat dissipation film.

In some embodiments, the display assembly further includes: a cover plate, a fifth adhesive layer, a touch layer, a polarizer, a sixth adhesive layer and a heat dissipation film that are stacked in sequence, and a touch circuit board. The panel body of the display panel is disposed between the sixth adhesive layer and the heat dissipation film. An end of the touch circuit board is bonded to the touch layer, and another end of the touch circuit board is bonded to the connection circuit board.

In a third aspect, some embodiments of the present disclosure provide a method for assembling the display assembly according to any one of the embodiments in the second aspect. The method includes: assembling the near field communication antenna with the connection circuit board to form the circuit board assembly before the first end of the connection circuit board is electrically connected to the display panel.

In some embodiments, assembling the near field communication antenna with the connection circuit board to form the circuit board assembly before the first end of the connection circuit board is electrically connected to the display panel includes, includes: bonding a chip on film to the display panel; and assembling the near field communication antenna with the connection circuit board to form the circuit board assembly before the first end of the connection circuit board is bonded to the chip on film.

In a fourth aspect, some embodiments of the present disclosure provide a display device. The display device includes: a housing, a main board and the display assembly according to any one of the embodiments in the second aspect. The main board, and the display panel and the circuit board assembly of the display assembly are all disposed inside the housing.

In some embodiments, the housing includes a front housing and a rear housing. The front housing includes: a second bottom wall, a second side wall located at a periphery of the second bottom wall, and a flange extending toward an outer side of the front housing. The flange is located on a side of the second side wall away from the second bottom wall. The rear housing includes a third bottom wall and a third side wall located at a periphery of the third bottom wall. The third side wall is stuck outside the second side wall and abuts against the flange.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these accompanying drawings. In addition, the accompanying drawings to be described below may be regarded as schematic diagrams, and are not limitations on actual sizes of products, actual processes of methods and actual timings of signals involved in the embodiments of the present disclosure.

DETAILED DESCRIPTION

Figure 1:
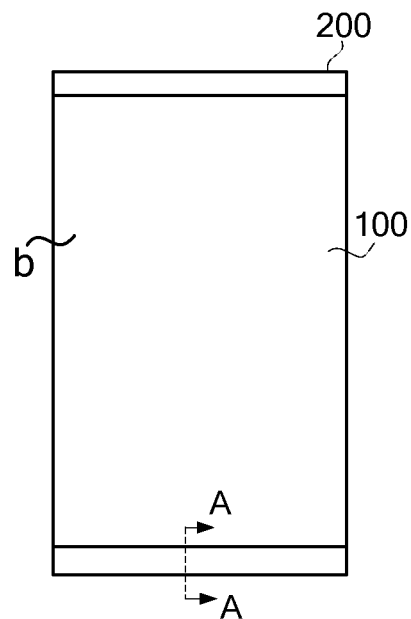
FIG. 1 is a front view of a display device (a mobile phone), in accordance with some embodiments of the present disclosure.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above term do not necessarily refer to the same embodiment(s) or example(s). In addition, the specific features, structures, materials, or characteristics may be included in any one or more embodiments or examples in any suitable manner.

Hereinafter, the terms such as "first" and "second" are used for descriptive purposes only, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the terms "a plurality of", "the plurality of" and "multiple" each mean two or more unless otherwise specified.

In the description of some embodiments, the expressions "coupled" and "connected" and derivatives thereof may be used. For example, the term "connected" may be used in the description of some embodiments to indicate that two or more components are in direct physical or electrical contact with each other. As another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The phrase "applicable to" or "configured to" used herein means an open and inclusive expression, which does not exclude devices that are applicable to or configured to perform additional tasks or steps.

In addition, the phrase "based on" used is meant to be open and inclusive, since a process, step, calculation or other action that is "based on" one or more of the stated conditions or values may, in practice, be based on additional conditions or value exceeding those stated.

The term "about" or "substantially" as used herein includes a stated value and an average value within an acceptable range of deviation of a particular value. The acceptable range of deviation is determined by a person of ordinary skill in the art in view of the measurement in question and the errors associated with the measurement of a particular quantity (i.e., the limitations of the measurement system).

Exemplary embodiments are described herein with reference to sectional views and/or plan views as idealized exemplary drawings. In the accompanying drawings, thickness of layers and sizes of regions are enlarged for clarity. Variations in shapes relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a feature of being curved. Therefore, the regions shown in the accompanying drawings are schematic in nature, and their shapes are not intended to show actual shapes of regions of a device, and are not intended to limit the scope of the exemplary embodiments.

A display device in embodiments of the present disclosure may be a display device having a near field communication antenna, such as a mobile phone or a smart watch, which is not specifically limited here.

A structure of the display device is described below by taking the mobile phone as an example, and a structure of a display device of other type may be arranged with reference to a structure of a circuit board assembly in the mobile phone provided in embodiments.

As shown in FIG. 1, FIG. 1 is a front view of the display device (the mobile phone) in some embodiments of the present disclosure. The display device includes a housing 200 and a display assembly 100 disposed in the housing 200. The housing 200 has a substantially rectangular shape. The reference sign b indicates a display area of the display device.

Figure 2:
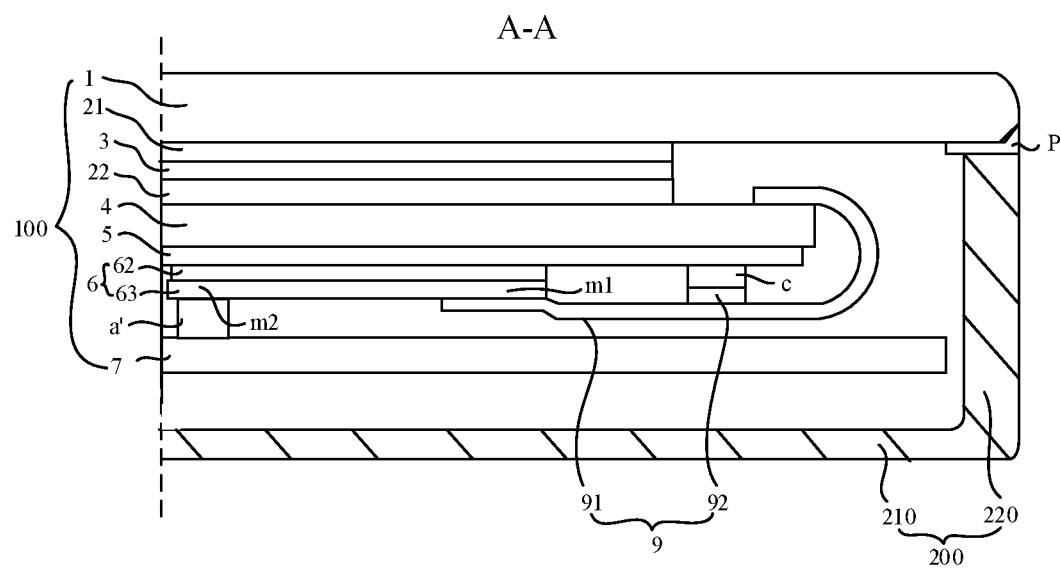
FIG. 2 is a section view taken along the line A-A in FIG. 1.

As shown in FIG. 2, FIG. 2 is a section view taken along the line A-A in FIG. 1. The housing 200 includes a first bottom wall 210 and a first side wall 220 disposed at an edge of the first bottom wall 210. The display assembly 100 includes a cover plate 1, a third adhesive layer 21, a polarizer 3, a fourth adhesive layer 22, a display panel 4 and a heat dissipation film 5 that are stacked in sequence. The cover plate 1 is adhered to the first side wall 220 of the housing 200 through an adhesive P. The polarizer 3, the display panel 4 and the heat dissipation film 5 are all disposed in a space formed by the housing 200 and the cover plate 1. The display panel 4 is a flexible display panel integrated with a touch layer, so that there is no need to provide an additional touch panel. This helps reduce the stack thickness of the display assembly 100.

The flexible display panel 4 may be an organic light-emitting diode (OLED) display panel, or may be other flexible display panel, which is not specifically limited here. The third adhesive layer 21 and the fourth adhesive layer 22 may both be optically clear adhesive (OCA) layers, but are not limited thereto. They may both be other adhesive layers capable of realizing adhesion.

The display assembly 100 further includes a chip on film (COF) 9 and a circuit board assembly 6, and the circuit board assembly 6 includes the near field communication (NFC) antenna 62 and a connection circuit board 63 that are both located on a back side (i.e., a non-display side) of the display panel 4. The NFC antenna 62 is in a shape of a plate and is attached between the heat dissipation film 5 and the connection circuit board 63. The connection circuit board 63 may be a flexible printed circuit (FPC) board, or a common non-bendable circuit board, which is not specifically limited here.

As shown in FIG. 2, the COF 9 includes a carrier film 91 and a driver chip (IC) 92 disposed on the carrier film 91. One end of the carrier film 91 is bonded to the display panel 4, and the other end of the carrier film 91 is bonded to a first end (the m1 end as shown in FIG. 2) of the connection circuit board 63. The driver chip 92 is adhered to the heat dissipation film 5 through an adhesive tape c.

The display device further includes a main board 7. The main board 7 is disposed inside the housing 200 and located on a side of the connection circuit board 63 away from the display panel 4. A second end (the m2 end as shown in FIG. 2) of the connection circuit board 63 is electrically connected to the main board 7 through a connector a'.

Figure 3:
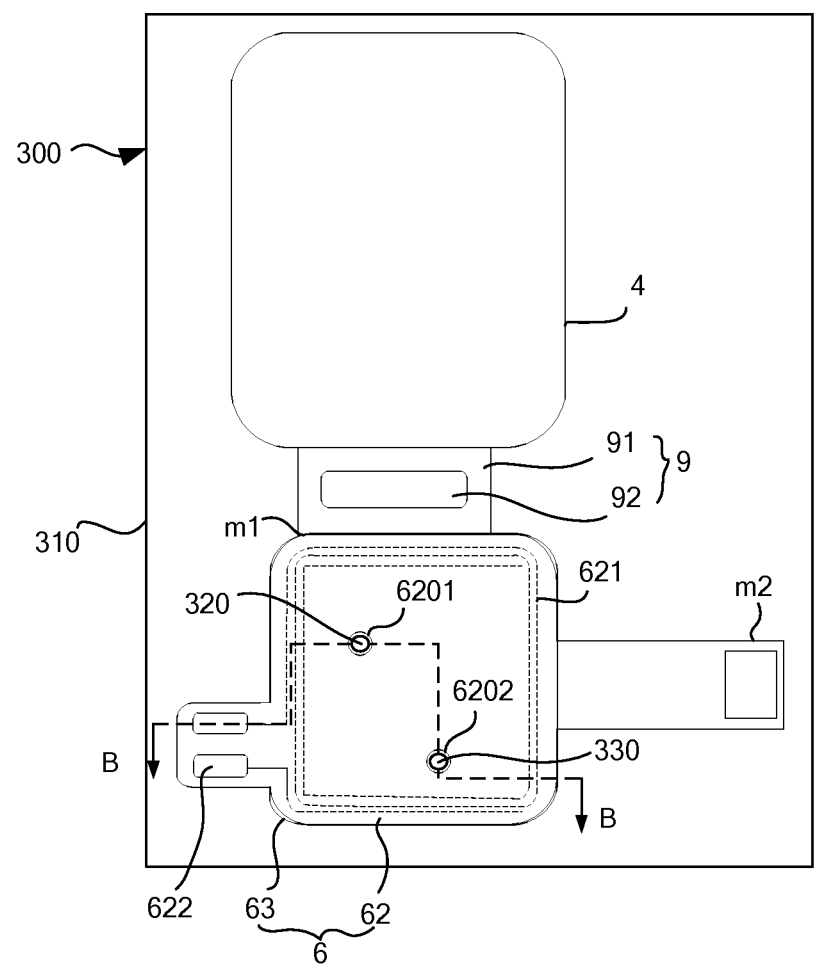
FIG. 3 is a diagram showing a state of a near field communication antenna being attached to a connection circuit board on an attaching fixture, in accordance with some embodiments of the present disclosure.
Figure 4:
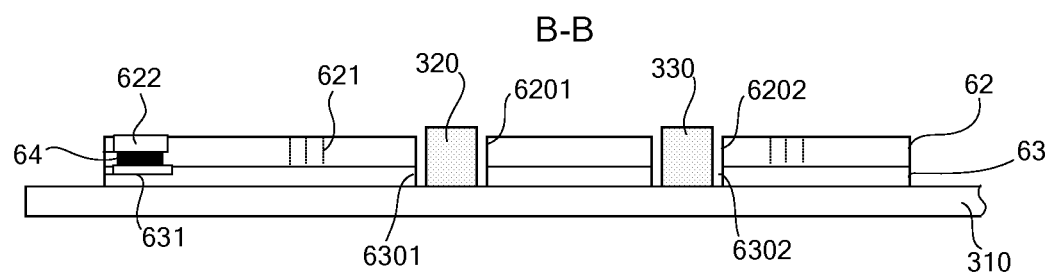
FIG. 4 is a section view taken along the line B-B in FIG. 3.

As shown in FIGS. 3 and 4, FIG. 3 is a diagram showing a state of the NFC antenna 62 being attached to the connection circuit board 63 on an attaching fixture 300 in some embodiments of the present disclosure, and FIG. 4 is a section view taken along the line B-B in FIG. 3. The connection circuit board 63 has circuit board pads 631, and a first positioning hole 6301 and a second positioning hole 6302.

The NFC antenna 62 includes an antenna coil 621 and antenna pads 622 electrically connected to the antenna coil 621. The antenna pad 622 has a substantially rectangular shape and is disposed opposite to a circuit board pad 631. The NFC antenna 62 is further provided therein with a third positioning hole 6201 and a fourth positioning hole 6202. The circuit board assembly 6 further includes a solder 64 disposed between the antenna pad 622 and the circuit board pad 631, so that the antenna pad 622 is electrically connected to the circuit board pad 631.

The solder 64 may be a solder paste or other solder 64, which is not specifically limited here.

The attaching fixture 300 includes an attaching stage 310, and a first positioning column 320 and a second positioning column 330 that are disposed on the attaching stage 310. When the NFC antenna 62 is attached to the connection circuit board 63, the first positioning hole 6301 and the second positioning hole 6302 in the connection circuit board 63 are respectively matched with the first positioning column 320 and the second positioning column 330 first, and then the third positioning hole 6201 and the fourth positioning hole 6202 in the NFC antenna 62 are respectively matched with the first positioning column 320 and the second positioning column 330. As a result, the pre-alignment of the NFC antenna 62 and the connection circuit board 63 is achieved. Next, the solder 64 is coated between the antenna pad 622 and the circuit board pad 631; then, pressure welding is performed on the antenna pad 622 of the NFC antenna 62 and the circuit board pad 631 of the connection circuit board 63 to ensure the conduction therebetween; and finally, an adhesive layer is provided between the NFC antenna 62 and the connection circuit board 63 to enable the two to be attached together.

However, the attachment of the NFC antenna 62 and the connection circuit board 63 needs to be achieved through a cooperation between the positioning holes in the NFC antenna 62, the positioning holes in the connection circuit board 63 and the positioning columns of the attaching fixture 300; and there are inevitably errors in sizes and positions between the first positioning hole 6301 and the third positioning hole 6201, and between the second positioning hole 6302 and the fourth positioning hole 6202. Thus, it affects the alignment accuracy of the NFC antenna 62 and the connection circuit board 63, and is not conducive to the subsequent welding between the antenna pads 622 and the circuit board pads 631.

Figure 5:
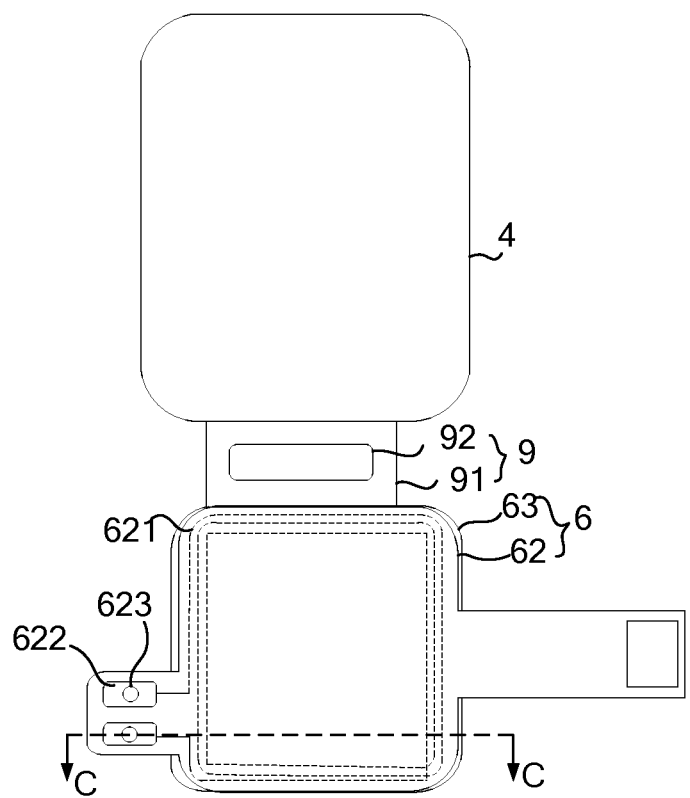
FIG. 5 is an expanded view of a circuit board assembly and a display panel, in accordance with some embodiments of the present disclosure.
Figure 6:
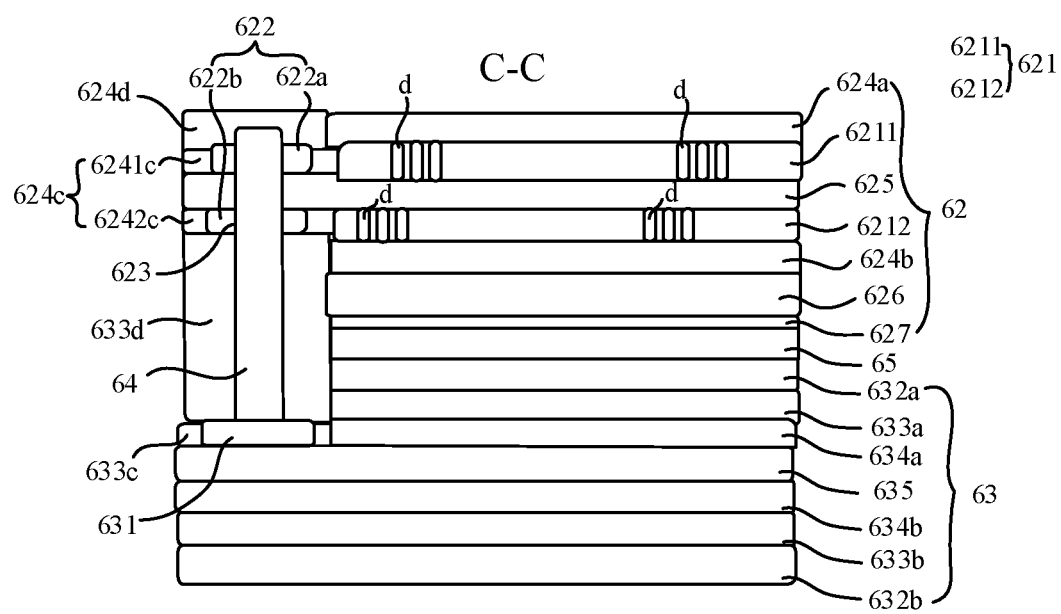
FIG. 6 is a section view taken along the line C-C in FIG. 5.

As shown in FIGS. 5 and 6, FIG. 5 is an expanded view of the circuit board assembly 6 and the display panel 4 in some embodiments of the present disclosure, and FIG. 6 is a section view taken along the line C-C in FIG. 5. The NFC antenna 62 is attached to the connection circuit board 63. The NFC antenna 62 includes: an antenna coil 621, antenna pads 622 electrically connected to the antenna coil 621, and through holes 623 penetrating the antenna pads 622 and disposed opposite to the circuit board pads 631. The solder 64 is connected to the circuit board pad 631 through the through hole 623, so that the antenna pad 622 is electrically connected to the circuit board pad 631.

In the embodiments, the NFC antenna 62 may be assembled with the connection circuit board 63 through a surface mount technology (SMT) process. The through holes 623 in the antenna pads 622 are firstly captured by a charge coupled device (CCD) camera of a mounting equipment to be respectively aligned with the circuit board pads 631; and then the solder 64 is injected into the through hole 623 in the antenna pad 622, so that the solder 64 is connected to the circuit board pad 631. As a result, the antenna pad 622 is soldered to the circuit board pad 631, which ensures the electrical connection between the antenna pad 622 and the circuit board pad 631. Finally, a region of the NFC antenna 62 other than the antenna pads 622 is adhered to the connection circuit board 63, so that the two are attached to each other.

Since the NFC antenna 62 has the through hole 623 penetrating the antenna pad 622, the CCD camera of the mounting equipment may be used to capture the through hole 623 in the antenna pad 622 during assembly, so as to realize the alignment of the through hole 623 and the circuit board pad 631. In this way, it is not necessary to realize the alignment of the NFC antenna 62 and the connection circuit board 63 through the cooperation between the positioning holes and the positioning columns, thereby avoiding inaccurate alignment caused by the alignment through the cooperation between the positioning holes and the positioning columns. As a result, it not only improves the alignment accuracy of the NFC antenna 62 and the connection circuit board 63, but also has no need to provide positioning holes in the NFC antenna 62 and the connection circuit board 63, which saves the time for providing the positioning holes in the NFC antenna 62 and the connection circuit board 63, and thus helps improve the assembly efficiency of the NFC antenna 62 and the connection circuit board 63.

A diameter of the through hole 623 should not be too large and too small. In a case where the diameter of the through hole 623 is too small, the solder 64 cannot flow into the through hole 623, which will increase the risk of pseudo soldering between the antenna pad 622 and the circuit board pad 631. In a case where the diameter of the through hole 623 is too large, there will be too much space of the antenna pad 622 to be occupied. It has been found through research that, in a case where the diameter of the through hole 623 is 0.3 mm, it can not only ensure that the solder 64 flows into the through hole 623 smoothly, but also enable the through hole 623 not to occupy too much space.

The arrangement position of the antenna pads 622 of the NFC antenna 62 is not unique. In some embodiments, as shown in FIGS. 5 and 6, the antenna pads 622 are disposed outside a region surrounded by the antenna coil 621.

Figure 7:
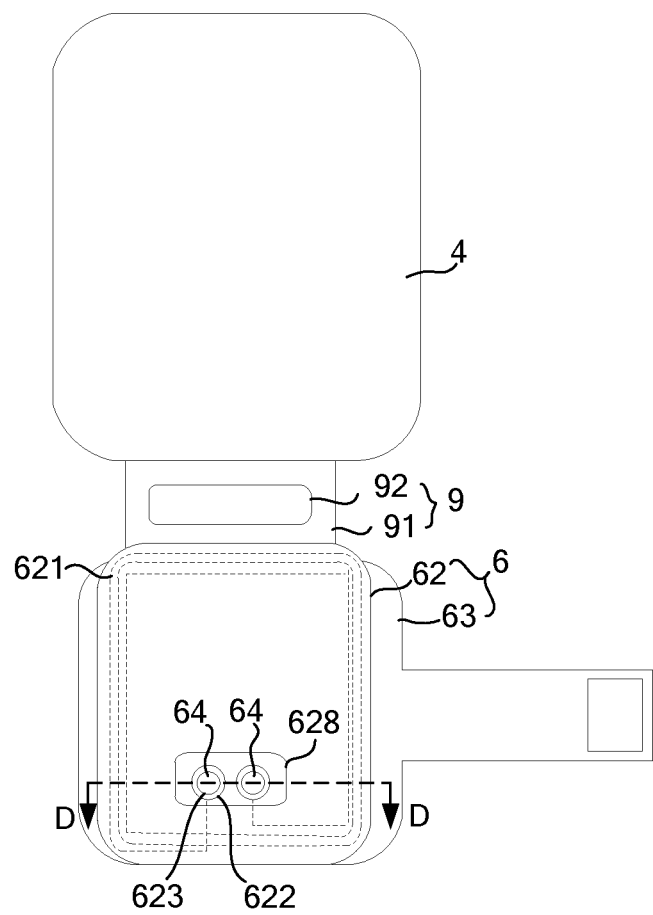
FIG. 7 is an expanded view of a circuit board assembly and a display panel, in accordance with some other embodiments of the present disclosure.
Figure 8:
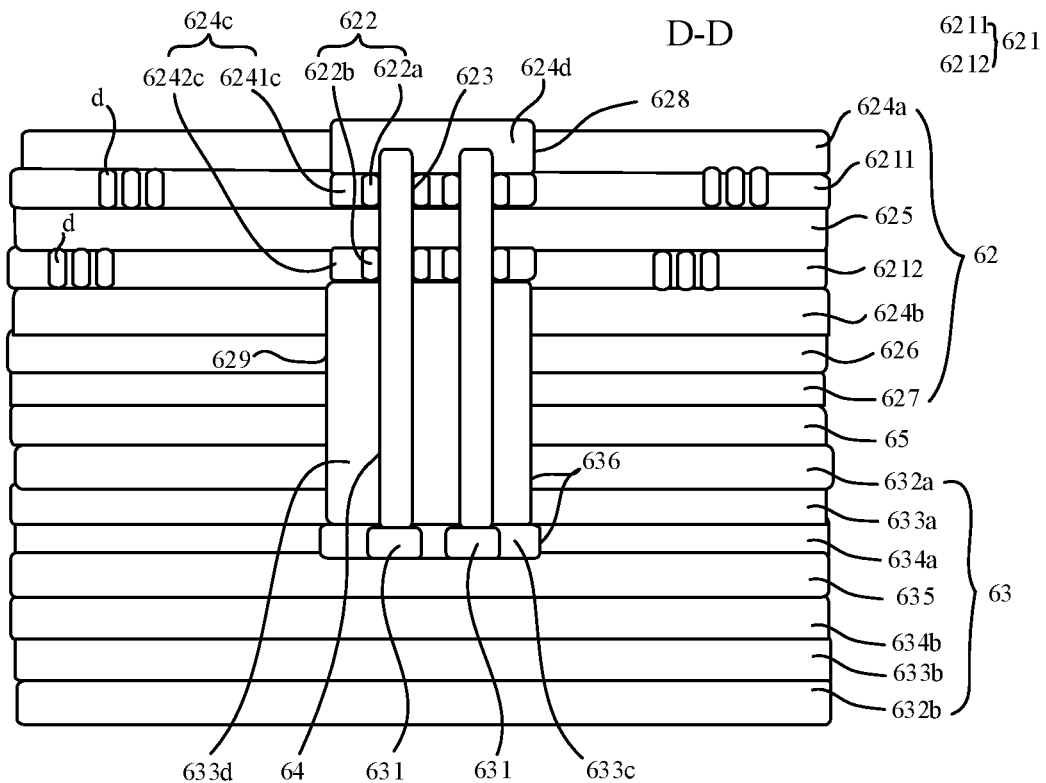
FIG. 8 is a section view taken along the line D-D in FIG. 7.

As shown in FIGS. 7 and 8, FIG. 7 is an expanded view of the circuit board assembly 6 and the display panel 4 in some other embodiments of the present disclosure, and FIG. 8 is a section view taken along the line D-D in FIG. 7. The antenna pads 622 are disposed in the region surrounded by the antenna coil 621. By arranging the antenna pads 622 in the region surrounded by the antenna coil 621, the antenna pads 622 may make full use of the space of the NFC antenna 62, which helps reduce the space occupied by the NFC antenna 62.

Structures of the NFC antenna 62 and the connection circuit board 63 are not unique. In some embodiments, the NFC antenna 62 is of a double-layer coil structure, and the connection circuit board 63 is of a double-layer circuit board structure. The specific structures are as follows.

As shown in FIGS. 6 and 8, the NFC antenna 62 includes a first insulating layer 624a, a first coil 6211, a first carrying layer 625, a second coil 6212, a second insulating layer 624b, a first adhesive layer 626 and a magnetic material layer 627 that are stacked in sequence. The connection circuit board 63 includes a first electromagnetic shielding layer 632a, a fifth insulating layer 633a, a first conductive layer 634a, a second carrying layer 635, a second conductive layer 634b, a sixth insulating layer 633b, and a second electromagnetic shielding layer 632b that are stacked in sequence. The circuit board assembly 6 further includes a second adhesive layer 65 disposed between the magnetic material layer 627 and the connection circuit board 63.

Figure 9:
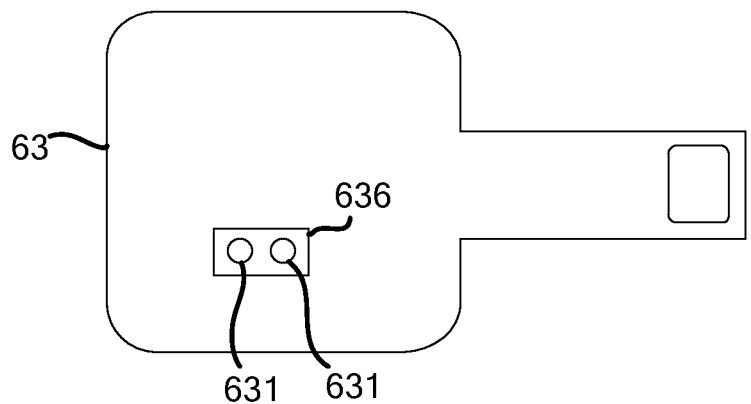
FIG. 9 is a top view of a connection circuit board in FIG. 7.
Figure 10:
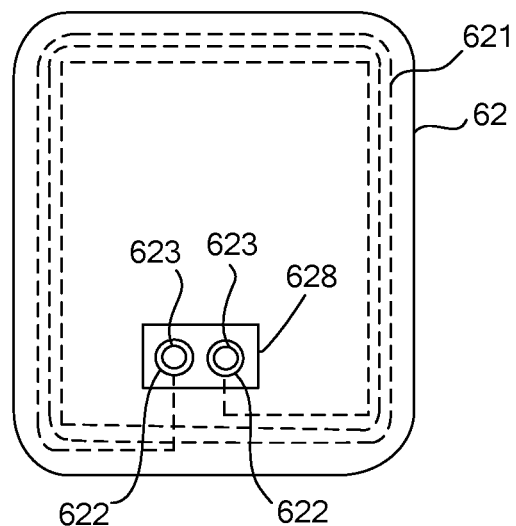
FIG. 10 is a top view of a near field communication antenna in FIG. 7.

As shown in FIGS. 8, 9 and 10, FIG. 9 is a top view of the connection circuit board 63 in FIG. 7, and FIG. 10 is a top view of the NFC antenna 62 in FIG. 7. The numbers of the circuit board pads 631, the antenna pads 622, the through holes 623 and the solders 64 each are two. Each circuit board pad 631 is disposed on a surface of the second carrying layer 635 proximate to the NFC antenna 62; the two antenna pads 622 are both disposed on the first carrying layer 625; and each antenna pad 622 includes a first sub-pad 622a located on a side of the first carrying layer 625 away from the connection circuit board 63 (a sub-pad located on a upper side of the first carrying layer 625) and a second sub-pad 622b located on a side of the first carrying layer 625 proximate to the connection circuit board 63 (a sub-pad located on a lower side of the first carrying layer 625).

The two through holes 623 are disposed opposite to the two circuit board pads 631 in a one-to-one correspondence, and each through hole 623 penetrates the first carrying layer 625 and a corresponding antenna pad 622. Each solder 64 is connected to a corresponding circuit board pad 631 through a through hole 623.

It will be noted that, when the NFC antenna 62 and the connection circuit board 63 are attached, the antenna pads 622 and the circuit board pads 631 are exposed. For example, as shown in FIGS. 8 and 9, the connection circuit board 63 is provided therein with a first avoidance opening 636, and a position of the first avoidance opening 636 corresponds to a position of the circuit board pads 631, so that the circuit board pads 631 are exposed. As shown in FIGS. 7 and 8, the NFC antenna 62 is provided therein with a second avoidance opening 628 and a third avoidance opening 629. A position of the second avoidance opening 628 corresponds to a position of first sub-pads 622a of the antenna pads 622, so that the first sub-pads 622a are exposed; and a position of the third avoidance opening 629 corresponds to a position of second sub-pads 622b of the antenna pads 622, so that the second sub-pads 622b are exposed.

Figure 11:
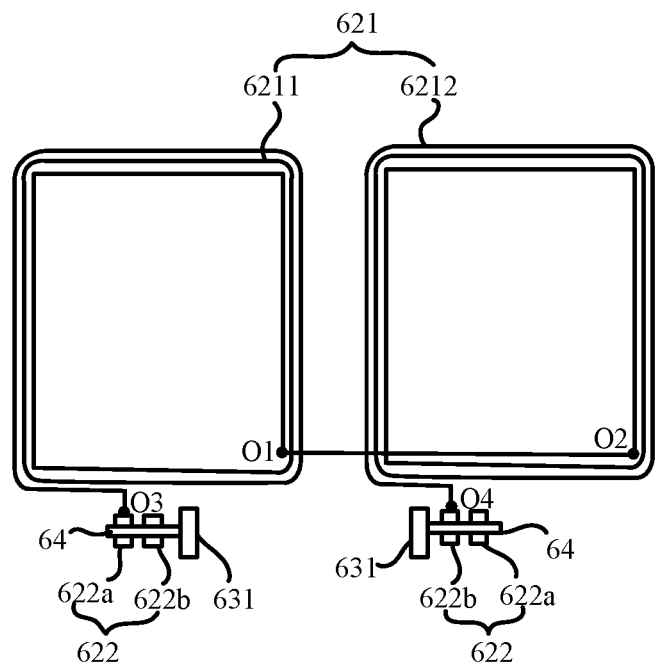
FIG. 11 is a diagram showing a connection principle between an antenna coil and antenna pads of a near field communication antenna, in accordance with some embodiments of the present disclosure.

As shown in FIGS. 6, 8 and 11, FIG. 11 is a diagram showing a connection principle of the antenna coil 621 and the antenna pads 622 of the NFC antenna 62 in some embodiments of the present disclosure. A first end O1 of the first coil 6211 is electrically connected to a first end O2 of the second coil 6212. For example, the electrical connection between the first end O1 of the first coil 6211 and the first end O2 of the second coil 6212 may be achieved through a via hole penetrating the first carrying layer 625, so as to form the antenna coil 621. A second end O3 of the first coil 6211 and a second end O4 of the second coil 6212 are electrically connected to the two antenna pads 622 in a one-to-one correspondence. That is, the first coil 6211 and the second coil 6212 are connected in series, and then two ends of the first coil 6211 and the second coil 6212 that are connected in series are electrically connected to the two antenna pads 622 in the one-to-one correspondence.

As shown in FIGS. 6 and 8, the first insulating layer 624a, the second insulating layer 624b, the fifth insulating layer 633a and the sixth insulating layer 633b each may be a protective layer (an overlay).

As shown in FIG. 8, the first coil 6211 and upper sub-pads (i.e., the first sub-pads 622a) of the two antenna pads 622 may be formed by performing a patterning process including etching on a same conductive layer, and the second coil 6212 and lower sub-pads (i.e., the second sub-pads 622b) of the two antenna pads 622 may be formed by performing a patterning process including etching on a same conductive layer (e.g., a copper layer). In FIGS. 6 and 8, the reference sign d denotes a gap region where a material is removed.

The first carrying layer 625 and the second carrying layer 635 each may be made of polyimide (PI), but are not limited thereto. They may be made of other insulating base material.

The first adhesive layer 626 and the second adhesive layer 65 each may be an acrylic hot-melt adhesive layer, but are not limited thereto. They may be other adhesive layers that can realize adhesion.

The magnetic material layer 627 may be a ferrite layer, but is not limited thereto. The magnetic material layer 627 may be other magnetic material layer 627.

The first electromagnetic shielding layer 632a and the second electromagnetic shielding layer 632b are used to protect a circuit of the connection circuit board 63 from electromagnetic interference of components such as the NFC antenna 62. Of course, in a case where the connection circuit board 63 adopts other anti-electromagnetic interference measure, the first electromagnetic shielding layer 632a and the second electromagnetic shielding layer 632b may not be provided.

The first conductive layer 634a and the second conductive layer 634b each may be a metal layer, e.g., a copper layer. The circuit board pad 631 and the first conductive layer 634a may be made of a same material, or different materials, which is not specifically limited here.

In the embodiments, the antenna coil 621 is arranged to be of a two-layer structure (i.e., including the first coil 6211 and the second coil 6212), which may enhance the strength of a signal generated by the antenna coil 621 and improve the communication effect of the NFC antenna 62. The connection circuit board 63 is arranged as a double-layer circuit board, which increases the layout space of components of the connection circuit board 63 and facilitates the optimized layout of the components of the connection circuit board 63.

Of course, the NFC antenna 62 is not limited to be of a double-coil structure, and the NFC antenna 62 may be arranged to be of a single-layer coil structure. That is, the second coil 6212 and the second insulating layer 624b as shown in FIGS. 6 and 8 are removed. The connection circuit board 63 is also not limited to be of the double-layer circuit board structure, and the connection circuit board 63 may be arranged to be of a single-layer circuit board structure. That is, the second conductive layer 634b and the sixth insulating layer 633b as shown in FIGS. 6 and 8 are removed.

In some embodiments, as shown in FIGS. 6 and 8, the NFC antenna 62 further includes a third insulating layer 624c disposed on the first carrying layer 625, and the third insulating layer 624c separates the two antenna pads 622. In this way, the two antenna pads 622 may be better insulated, which greatly reduces the probability of a short circuit happened to the two antenna pads 622.

The third insulating layer 624c includes an upper insulating layer 6241c disposed on a surface of the first carrying layer 625 away from the connection circuit board 63, and a lower insulating layer 6242c disposed on a surface of the first carrying layer 625 proximate to the connection circuit board 63. The upper insulating layer 6241c is disposed in the second avoidance opening 628 and separates two first sub-pads 622a, and the lower insulating layer 6242c is disposed in the third avoidance opening 629 and separates two second sub-pads 622b. The upper insulating layer 6241c and the lower insulating layer 6242c each may be an insulating green oil layer, but are not limited thereto. They may be insulating layers of other types.

In some embodiments, as shown in FIGS. 6 and 8, the NFC antenna 62 further includes a fourth insulating layer 624d. The fourth insulating layer 624d covers each first sub-pad 622a. By arranging the fourth insulating layer 624d, it may not only prevent a short circuit between the two first sub-pads 622a, but also protect the first sub-pads 622a and prevent corrosion of water and oxygen.

As shown in FIG. 8, the fourth insulating layer 624d may fill in the second avoidance opening 628 to cover each first sub-pad 622a. The fourth insulating layer 624d may be an insulating adhesive layer (e.g., a fluorinated liquid layer), and the insulating adhesive layer may be coated through an adhesive dispensing process.

In some embodiments, as shown in FIGS. 6 and 8, the connection circuit board 63 further includes a seventh insulating layer 633c disposed on the second carrying layer 635. The seventh insulating layer 633c is disposed in the first avoidance opening 636 and separates the two circuit board pads 631. In this way, the circuit board pads 631 and the first conductive layer 634a may be better insulated, which greatly reduces the probability of the short circuit happened between the two circuit board pads 631.

The seventh insulating layer 633c may be an insulating green oil layer, but is not limited thereto. The seventh insulating layer 633c may also be an insulating layer of other type.

In some embodiments, as shown in FIGS. 6 and 8, the connection circuit board 63 further includes an eighth insulating layer 633d formed by a portion of a material for forming the second adhesive layer 65. The eighth insulating layer 633d fills in a gap between the circuit board pads 631 and the second sub-pads 622b.

In the case where the NFC antenna 62 is attached to the connection circuit board 63, the portion of the material for forming the second adhesive layer 65 overflows into the gap between the circuit board pads 631 and the second sub-pads 622b under pressing of the pressure. That is, the portion of the material for forming the second adhesive layer 65 overflows into the third avoidance opening 629 and the first avoidance opening 636 to form the eighth insulating layer 633d. By arranging the eighth insulating layer 633d, it may be possible to protect the circuit board pads 631 and the second sub-pads 622b, so as to prevent the circuit board pads 631 and the second sub-pads 622b from being corroded by external water and oxygen.

Figure 12:
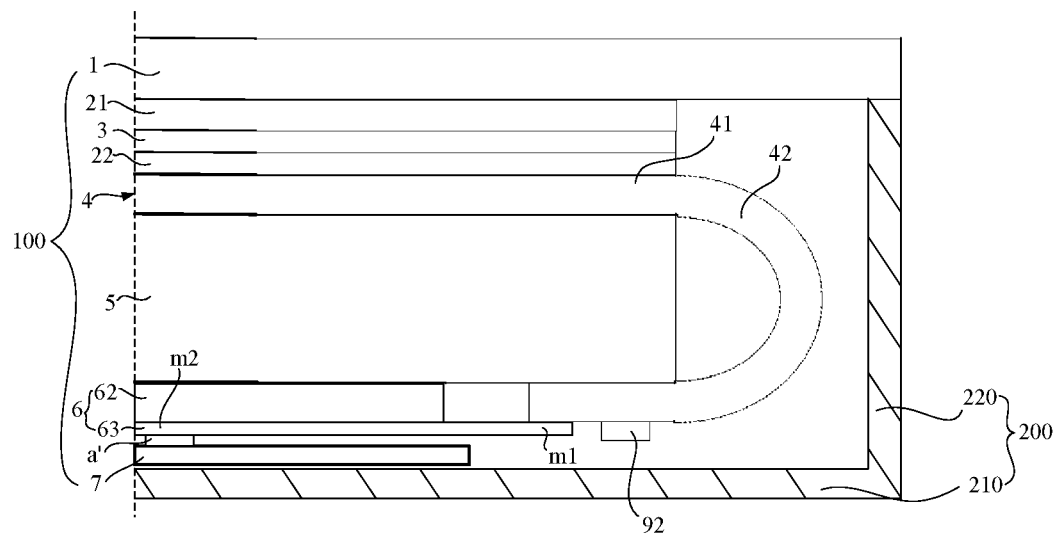
FIG. 12 is a partial section view of a display device, in accordance with some embodiments of the present disclosure.

FIG. 12 is a partial section view of the display device according to some embodiments of the present disclosure. A main difference between the structure of the display device in FIG. 12 and the structure of the display device in FIG. 2 is that the first end of the connection circuit board 63 in FIG. 12 is directly bonded to the display panel 4.

As shown in FIG. 12, the display panel 4 is the flexible display panel integrated with the touch layer, and the display panel 4 includes a panel body 41 and a bending portion 42 connected to a side of the panel body 41. The driver chip 92 is disposed on the bending portion 42. The cover plate 1, the third adhesive layer 21, the polarizer 3, the fourth adhesive layer 22, the panel body 41 and the heat dissipation film 5 are stacked in sequence.

An end of the bending portion 42 is located on the back side (i.e., the non-display side) of the panel body 41, and is bonded to the first end (the m1 end in FIG. 12) of the connection circuit board 63.

In the embodiments, a bonding area in which the flexible circuit board is bonded is thus omitted on an edge of the panel body 41, so that the size of a bezel of the display device may be reduced.

Figure 13:
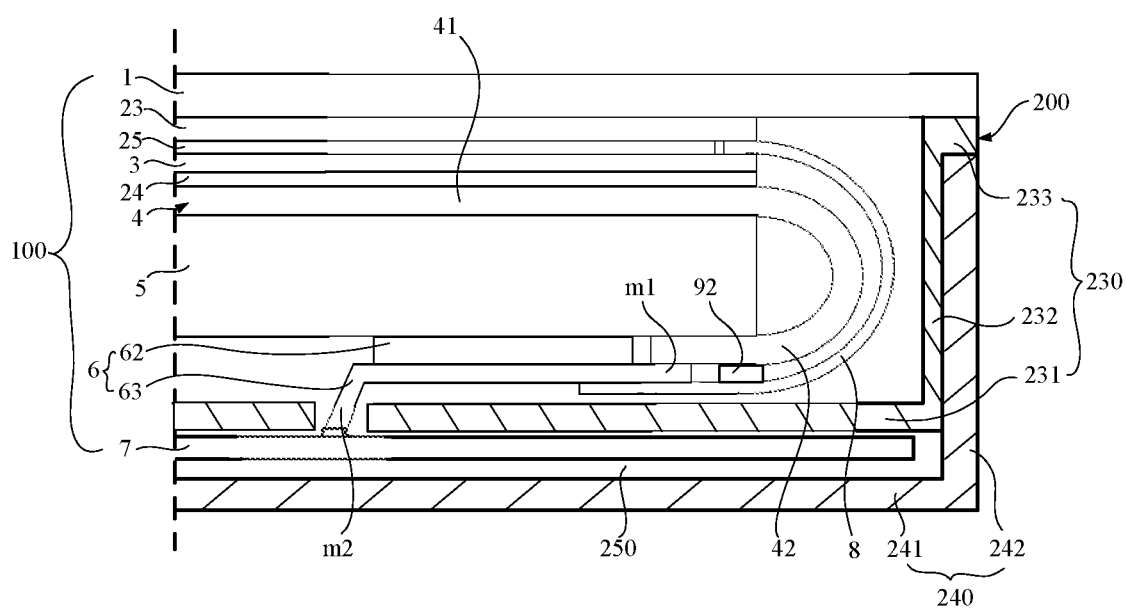
FIG. 13 is a partial section view of a display device, in accordance with some other embodiments of the present disclosure.

FIG. 13 is a partial section view of the display device according to some embodiments of the present disclosure. Main differences between the structure of the display device in FIG. 13 and the structure of the display device in FIG. 12 are that the panel body 41 and the touch layer 25 in FIG. 13 are arranged separately, and a structure of the housing 200 in FIG. 13 is different from a structure of the housing 200 in FIG. 12.

As shown in FIG. 13, the cover plate 1, a fifth adhesive layer 23, the touch layer 25, the polarizer 3, a sixth adhesive layer 24, the panel body 41 and the heat dissipation film 5 are stacked in sequence. The display assembly 100 further includes a touch circuit board 8, one end of the touch circuit board 8 is bonded to the touch layer 25, and the other end of the touch circuit board 8 is bonded to the connection circuit board 63.

The touch layer 25 and the polarizer 3 may be designed into one piece or separately designed, which is not specifically limited here. The fifth adhesive layer 23 and the sixth adhesive layer 24 may both be OCA layers, but are not limited thereto. They may be other adhesive layers capable of realizing adhesion.

The housing 200 includes a front housing 230 and a rear housing 240. The front housing 230 includes a second bottom wall 231 and a second side wall 232 located at a periphery of the second bottom wall 231. The front housing 230 further includes a flange 233 extending toward an outer side of the front housing 230, and the flange 233 is located on a side of the second side wall 232 away from the second bottom wall 231. The polarizer 3, the touch layer 25, the display panel 4, the heat dissipation film 5, the circuit board assembly 6, and the touch circuit board 8 are all located inside the front housing 230.

The rear housing 240 includes a third bottom wall 241 and a third side wall 242 located at a periphery of the third bottom wall 241. The third side wall 242 is stuck outside the second side wall 232 and abuts against the flange 233, so that the front housing 230 and the rear housing 240 are fastened together. An arrangement space 250 is formed between the second bottom wall 231 and the third bottom wall 241, and the main board 7 is disposed in the arrangement space 250. The second bottom wall 231 of the front housing 230 is provided with an opening therein, and the second end (the m2 end in FIG. 13) of the connection circuit board 63 extends into the arrangement space 250 through the opening and is electrically connected to the main board 7. By arranging the housing 200 to be a structure in which the front housing 230 and the rear housing 240 are fastened together, it is convenient to disassemble and replace the main board 7 in the arrangement space 250.

Figure 14:
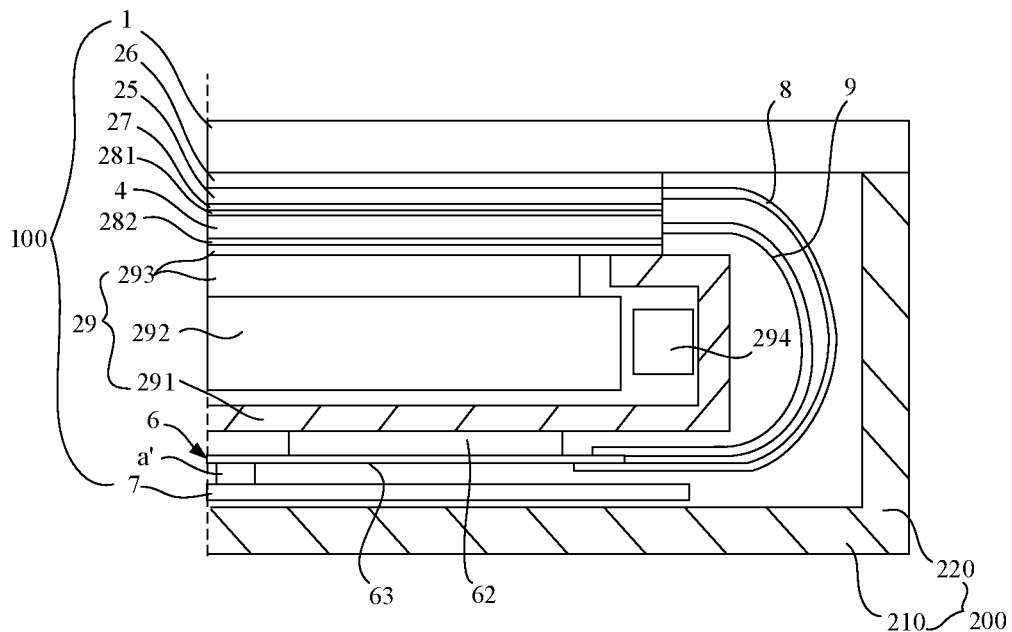
FIG. 14 is a partial section view of a display device, in accordance with yet some other embodiments of the present disclosure.

FIG. 14 is a partial section view of the display device according to some embodiments of the present disclosure. A main difference between the structure of the display device in FIG. 14 and the structure of the display device in FIG. 13 is that, the display panel in FIG. 13 is the flexible display panel 4, while the display panel 4 in FIG. 14 is a liquid crystal display panel 4.

As shown in FIG. 14, the display assembly 100 includes the cover plate 1, a seventh adhesive layer 26, the touch layer 25, an eighth adhesive layer 27, an upper polarizer 281, the display panel 4, a lower polarizer 282, a backlight source 29 and the circuit board assembly 6 that are disposed in sequence.

The backlight source 29 includes a backplane 291, a light guide plate 292 disposed on a side of the backplane 291, optical film(s) 293 disposed on a side of the light guide plate 292 proximate to the display panel 4 and a light source 294 disposed on a side of the light guide plate 292.

The NFC antenna 62 is in the shape of the plate and is attached between the backplane 291 and the connection circuit board 63.

The light source 294 may be a light-emitting diode (LED) lamp or a lamp tube, which is not specifically limited here. The seventh adhesive layer 26 and the eighth adhesive layer 27 may both be OCA layers, but are not limited thereto. They may be other adhesive layers capable of realizing adhesion.

Figure 15:
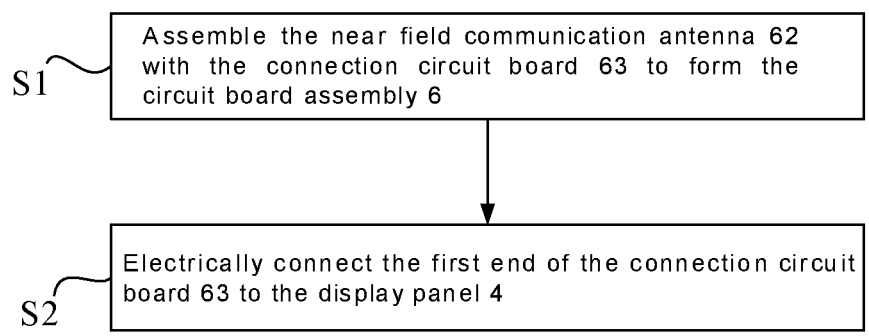
FIG. 15 is a flow diagram of an assembling method for a display assembly, in accordance with some embodiments of the present disclosure.

Some embodiments of the present disclosure provide an assembling method for the display assembly 100 described in any of the above embodiments. The assembling method includes following steps as shown in FIG. 15. FIG. 15 is a flow diagram of the assembling method for the display assembly 100 in the embodiments of the present disclosure.

In S1, as shown in FIG. 8, the NFC antenna 62 is assembled with the connection circuit board 63 to form the circuit board assembly 6.

The NFC antenna 62 may be assembled with the connection circuit board 63 through the SMT process. The through holes 623 in the antenna pads 622 are firstly captured by the CCD camera of the mounting equipment to be respectively aligned with the circuit board pads 631; then the solder 64 is injected into the through hole 623 in the antenna pad 622, so that the solder 64 is connected to the circuit board pad 631, and the antenna pad 622 is soldered to the circuit board pad 631; and finally, the region of the NFC antenna 62 other than the antenna pads 622 is adhered to the connection circuit board 63 by pressing. After the antenna pad 622 and the circuit board pad 631 are soldered, X-ray inspection is performed to ensure the soldering yield of the antenna pad 622 and the circuit board pad 631.

The NFC antenna 62 is assembled with the connection circuit board 63 through the SMT process, which can not only achieve a relatively high alignment accuracy, but also precisely control the amount of the solder 64 injected into the through hole 623 in the antenna pad 622 to precisely control the height of the solder 64, so that the electrical connection between the antenna pad 622 and the circuit board pad 631 can be achieved in a case where the height of the solder 64 is not more than 50 μm.

In S2, as shown in FIG. 7, the first end of the connection circuit board 63 is electrically connected to the display panel 4.

As shown in FIGS. 12 and 13, the first end (the m1 end in FIGS. 12 and 13) of the connection circuit board 63 may be directly bonded to the display panel 4 to achieve electrical connection. In addition, as shown in FIGS. 2 and 14, the first end of the connection circuit board 63 may be electrically connected to the display panel 4 indirectly. That is, the COF 9 is bonded to the display panel 4, and then the first end of the connection circuit board 63 is bonded to the COF 9, so that the first end of the connection circuit board 63 is electrically connected to the display panel 4.

In the assembling method for the display assembly 100, since the NFC antenna 62 is assembled with the connection circuit board 63 before the first end of the connection circuit board 63 is electrically connected to the display panel 4, when the NFC antenna 62 is assembled with the connection circuit board 63, it may avoid the damage to the display panel 4 caused by the assembly equipment, thereby improving the yield of the display assembly 100.

The assembling method for other components in the display assembly 100 will not be repeated here.

For features described in the embodiments of the assembly method for the display assembly 100 that are the same as or similar to those of product embodiments of the display assembly 100, reference may be made to the description in the product embodiments of the display assembly 100, which will not be repeated here.

In the above description of the embodiments, specific features, structures, materials or characteristics may be combined in any suitable manner in any one or more embodiments or examples.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A circuit board assembly, comprising:
   a connection circuit board including circuit board pads;
   a near field communication antenna attached to the connection circuit board, wherein the near field communication antenna includes: an antenna coil, antenna pads electrically connected to the antenna coil, and through holes penetrating the antenna pads and disposed opposite to the circuit board pads; and
   solders, wherein the solders are connected to the circuit board pads through the through holes, so that the antenna pads are electrically connected to the circuit board pads, respectively; wherein
   the near field communication antenna further includes: a first insulating layer, a first coil, a first carrying layer, a second coil, a second insulating layer, a first adhesive layer and a magnetic material layer that are stacked in sequence; a first end of the first coil is electrically connected to a first end of the second coil to constitute the antenna coil;
   numbers of the circuit board pads, the antenna pads, the through holes and the solders each are two;
   the two antenna pads are both disposed on the first carrying layer, and are electrically connected to a second end of the first coil and a second end of the second coil in a one-to-one correspondence;
   the two through holes are disposed opposite to the two circuit board pads in a one-to-one correspondence, and each through hole penetrates the first carrying layer and a corresponding antenna pad in the two antenna pads;
   each solder is connected to a corresponding circuit board pad in the two circuit board pads through a through hole in the two through holes; and
   the circuit board assembly further includes a second adhesive layer disposed between the magnetic material layer and the connection circuit board.

2. The circuit board assembly according to claim 1, wherein
the antenna pads are disposed in a region surrounded by the antenna coil.

3. The circuit board assembly according to claim 1, wherein
the near field communication antenna further includes a third insulating layer disposed on the first carrying layer, and the third insulating layer separates the two antenna pads.

4. The circuit board assembly according to claim 1, wherein
the antenna pads each include a first sub-pad located on a side of the first carrying layer away from the connection circuit board; and
the near field communication antenna further includes a fourth insulating layer covering each first sub-pad.

5. The circuit board assembly according to claim 1, wherein
the connection circuit board includes: a fifth insulating layer, a first conductive layer, a second carrying layer, a second conductive layer and a sixth insulating layer that are stacked in sequence; and
the circuit board pads are disposed on a surface of the second carrying layer proximate to the near field communication antenna.

6. The circuit board assembly according to claim 5, wherein
the connection circuit board further includes a first electromagnetic shielding layer and a second electromagnetic shielding layer;
the first electromagnetic shielding layer is disposed on a side of the fifth insulating layer away from the second carrying layer, and the second electromagnetic shielding layer is disposed on a side of the sixth insulating layer away from the second carrying layer.

7. The circuit board assembly according to claim 5, wherein
the connection circuit board further includes a seventh insulating layer disposed on the second carrying layer, and the seventh insulating layer separates the two circuit board pads.

8. The circuit board assembly according to claim 5, wherein
the antenna pads each include a second sub-pad located on a side of the first carrying layer proximate to the connection circuit board; and
the connection circuit board further includes an eighth insulating layer formed by a portion of a material for forming the second adhesive layer, and the eighth insulating layer fills in a gap between the circuit board pads and second sub-pads.

9. The circuit board assembly according to claim 5, wherein
the circuit board pads and the first conductive layer are made of a same material.

10. A display assembly, comprising:
a display panel; and
the circuit board assembly according to claim 1, wherein the near field communication antenna of the circuit board assembly is located on a back side of the display panel, a first end of the connection circuit board of the circuit board assembly is electrically connected to the display panel, and a second end of the connection circuit board is configured to be electrically connected to a main board.

11. A display device, comprising:
a housing;
a main board; and
the display assembly according to claim 10; wherein the main board, and the display panel and the circuit board assembly of the display assembly are all disposed inside the housing.

12. The display assembly according to claim 10, wherein
the display panel includes a panel body and a bending portion connected to a side of the panel body; the bending portion is configured such that a driver chip is disposed thereon, and an end of the bending portion is located on a back side of the panel body and bonded to the first end of the connection circuit board.

13. The display assembly according to claim 12, wherein the display panel is a flexible display panel integrated with a touch layer; and
the display assembly further comprises: a cover plate, a third adhesive layer, a polarizer, a fourth adhesive layer and a heat dissipation film that are stacked in sequence, wherein the panel body is disposed between the fourth adhesive layer and the heat dissipation film.

14. The display assembly according to claim 12, further comprising:
a cover plate, a fifth adhesive layer, a touch layer, a polarizer, a sixth adhesive layer and a heat dissipation film that are stacked in sequence, wherein the panel body of the display panel is disposed between the sixth adhesive layer and the heat dissipation film; and
a touch circuit board, wherein an end of the touch circuit board is bonded to the touch layer, and another end of the touch circuit board is bonded to the connection circuit board.

15. The display device according to claim 11, wherein the housing includes:
a front housing, wherein the front housing includes: a second bottom wall, a second side wall located at a periphery of the second bottom wall, and a flange extending toward an outer side of the front housing; the flange is located on a side of the second side wall away from the second bottom wall; and
a rear housing, wherein the rear housing includes a third bottom wall and a third side wall located at a periphery of the third bottom wall; the third side wall is stuck outside the second side wall and abuts against the flange.

16. The circuit board assembly according to claim 1, wherein
the antenna pads each include a first sub-pad located on a side of the first carrying layer away from the connection circuit board and a second sub-pad located on a side of the first carrying layer proximate to the connection circuit board; and
the near field communication antenna further includes a third insulating layer disposed on the first carrying layer; the third insulating layer includes an upper insulating layer disposed on a surface of the first carrying layer away from the connection circuit board, and a lower insulating layer disposed on a surface of the first carrying layer proximate to the connection circuit board;
the upper insulating layer separates first sub-pads of the antenna pads, and the lower insulating layer separates second sub-pads of the antenna pads.

17. The circuit board assembly according to claim 16, wherein
- the first coil and the first sub-pads of the antenna pads are located in a same layer and made of a same material; and
- the second coil and the second sub-pads of the antenna pads are located in a same layer and made of a same material.

\* \* \* \* \*